US009522521B2

(12) United States Patent
Yoon et al.

(10) Patent No.: US 9,522,521 B2
(45) Date of Patent: Dec. 20, 2016

(54) APPARATUS AND METHOD FOR SEPARATING A STACKED ARRANGEMENT

(71) Applicant: Nanyang Technological University, Singapore (SG)

(72) Inventors: Soon Fatt Yoon, Singapore (SG); Dawei Xu, Singapore (SG); Chiew Yong Yeo, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/390,239

(22) PCT Filed: Apr. 17, 2013

(86) PCT No.: PCT/SG2013/000150
§ 371 (c)(1),
(2) Date: Oct. 2, 2014

(87) PCT Pub. No.: WO2013/162468
PCT Pub. Date: Oct. 31, 2013

(65) Prior Publication Data
US 2015/0053352 A1    Feb. 26, 2015

Related U.S. Application Data

(60) Provisional application No. 61/637,020, filed on Apr. 23, 2012.

(51) Int. Cl.
*B32B 38/10* (2006.01)
*B32B 43/00* (2006.01)
(Continued)

(52) U.S. Cl.
CPC ....... *B32B 43/006* (2013.01); *H01L 21/67092* (2013.01); *H01L 21/7813* (2013.01);
(Continued)

(58) Field of Classification Search
CPC .. B32B 43/006; B32B 38/10; Y10T 156/1111; Y10T 156/1168; Y10T 156/1978; H01L 31/1896; H01L 2221/68381; H01L 2221/68386
See application file for complete search history.

(56) References Cited

U.S. PATENT DOCUMENTS 4,826,553 A * 5/1989 Armitage ............... B44C 1/17
                                                           156/233
4,846,931 A   7/1989 Gmitter et al.
(Continued)

FOREIGN PATENT DOCUMENTS

CN            1427749 A      7/2003
WO     WO 01/80286 A2      10/2001

OTHER PUBLICATIONS

Extended European Search Report for corresponding European Application No. 13 782 595.6 dated Oct. 6, 2015; 6 pages.
(Continued)

*Primary Examiner* — Mark A Osele
(74) *Attorney, Agent, or Firm* — Alston & Bird LLP

(57) ABSTRACT

In various embodiments, an apparatus for separating a stacked arrangement including a first layer, a second layer and a release layer between the first layer and the second layer may be provided. The apparatus may include an attachment surface configured to suspend the stacked arrangement by attaching to the first layer. The apparatus may further include an actuating mechanism configured to form a curvature of the first layer by bending the attachment surface. The apparatus may also include a holder to hold an etchant for etching the release layer to separate the first layer from the second layer.

18 Claims, 16 Drawing Sheets

(51) Int. Cl.
   *H01L 31/18* (2006.01)
   *H01L 21/78* (2006.01)
   *H01L 21/67* (2006.01)

(52) U.S. Cl.
   CPC ...... *H01L 31/1896* (2013.01); *B32B 2309/16* (2013.01); *H01L 2221/68386* (2013.01); *Y10T 156/1111* (2015.01); *Y10T 156/1168* (2015.01); *Y10T 156/1978* (2015.01)

(56) References Cited

U.S. PATENT DOCUMENTS

| | | |
|---|---|---|
| 6,071,795 A | 6/2000 | Cheung et al. |
| 8,003,492 B2 | 8/2011 | Gmitter et al. |
| 2006/0199382 A1 | 9/2006 | Sugiyama et al. |
| 2009/0221146 A1 | 9/2009 | Seko et al. |
| 2010/0001374 A1 | 1/2010 | Gmitter et al. |
| 2011/0214805 A1 | 9/2011 | Brown et al. |
| 2016/0204020 A1* | 7/2016 | Huang .............. H01L 21/67092 156/285 |

OTHER PUBLICATIONS

Yoon, Jongseung et al; "GaAs Photovoltaics and Optoelectronics Using Releasable Multilayer Expitaxial Assemblies"; *Nature*; vol. 465; May 20, 2010; pp. 329-334.

Yablonotich, Eli et al.; Extreme Selectivity in the Lift-Off of Epitaxial GaAs Films; *Appl. Phys. Lett.* 51 (26); Dec. 28, 1987; pp. 2222-2224.

Voncken, M.M.A.J. et al.; "Strain-Accelerated HF Etching of AlAs for Epitaxial Lift-Off"; *Journal of Physics; Condensed Matter*; 16 (2004); pp. 3585-3596.

International Search Report and Written Opinion for International Application No. PCT/SG2013/000150 dated Jun. 25, 2013.

International Preliminary Report on Patentability for International Application No. PCT/SG2013/000150 dated Oct. 28, 2014.

Office Action for Chinese Application No. 201380019900.4 dated Jul. 6, 2016.

* cited by examiner

Suspending the stacked arrangement by attaching the first layer to an attachment surface
402

Forming a curvature of the first layer of the stacked arrangement by bending the attachment surface using an actuating mechanism
404

Etching the release layer to separate the first layer from the second layer
406

APPARATUS AND METHOD FOR SEPARATING A STACKED ARRANGEMENT

CROSS-REFERENCE TO RELATED APPLICATIONS

This application claims the benefit of priority of U.S. application No. 61/637,020 filed Apr. 23, 2012, the contents of it being hereby incorporated by reference in its entirety for all purposes.

TECHNICAL FIELD

Various aspects of this disclosure relate to apparatuses and methods for separating stacked arrangements.

BACKGROUND

In epitaxial lift off (ELO), a device film may be separated from a substrate by lateral etching of a release layer between the device film and the substrate. The release layer may be deposited or grown on the substrate. The device film is then deposited or grown on the release layer.

The material for the release layer may be chosen to provide high etch selectivity from the rest of the structure for effective separation. The substrate may be reused for subsequent ELO processes to reduce costs.

It is necessary for this process to have a fast etch rate of the release layer for large scale manufacturing. In current methods, the etch rate of the release layer is insufficient for large scale manufacturing.

SUMMARY

In various embodiments, an apparatus for separating a stacked arrangement including a first layer, a second layer and a release layer between the first layer and the second layer may be provided. The apparatus may include an attachment surface configured to suspend the stacked arrangement by attaching to the first layer. The apparatus may further include an actuating mechanism configured to form a curvature of the first layer by bending the attachment surface. The apparatus may also include a holder to hold an etchant for etching the release layer to separate the first layer from the second layer.

In various embodiments, a method for separating a stacked arrangement including a first layer, a second layer and a release layer between the first layer and the second layer may be provided. The method may include suspending the stacked arrangement by attaching the first layer to an attachment surface. The method may further include forming a curvature of the first layer of the stacked arrangement by bending the attachment surface using an actuating mechanism. The method may also include etching the release layer to separate the first layer from the second layer.

BRIEF DESCRIPTION OF THE DRAWINGS

The invention will be better understood with reference to the detailed description when considered in conjunction with the non-limiting examples and the accompanying drawings, in which:

FIG. 4 shows a schematic of a method for separating a stacked arrangement according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

It should be understood that the terms "top", "bottom", "down", "side" etc., when used in the following description are used for convenience and to aid understanding of relative positions or directions, and not intended to limit the orientation of the stacked arrangement, the layers included in the stacked arrangement or the apparatus for separating the stacked arrangement.

Figure 1A:
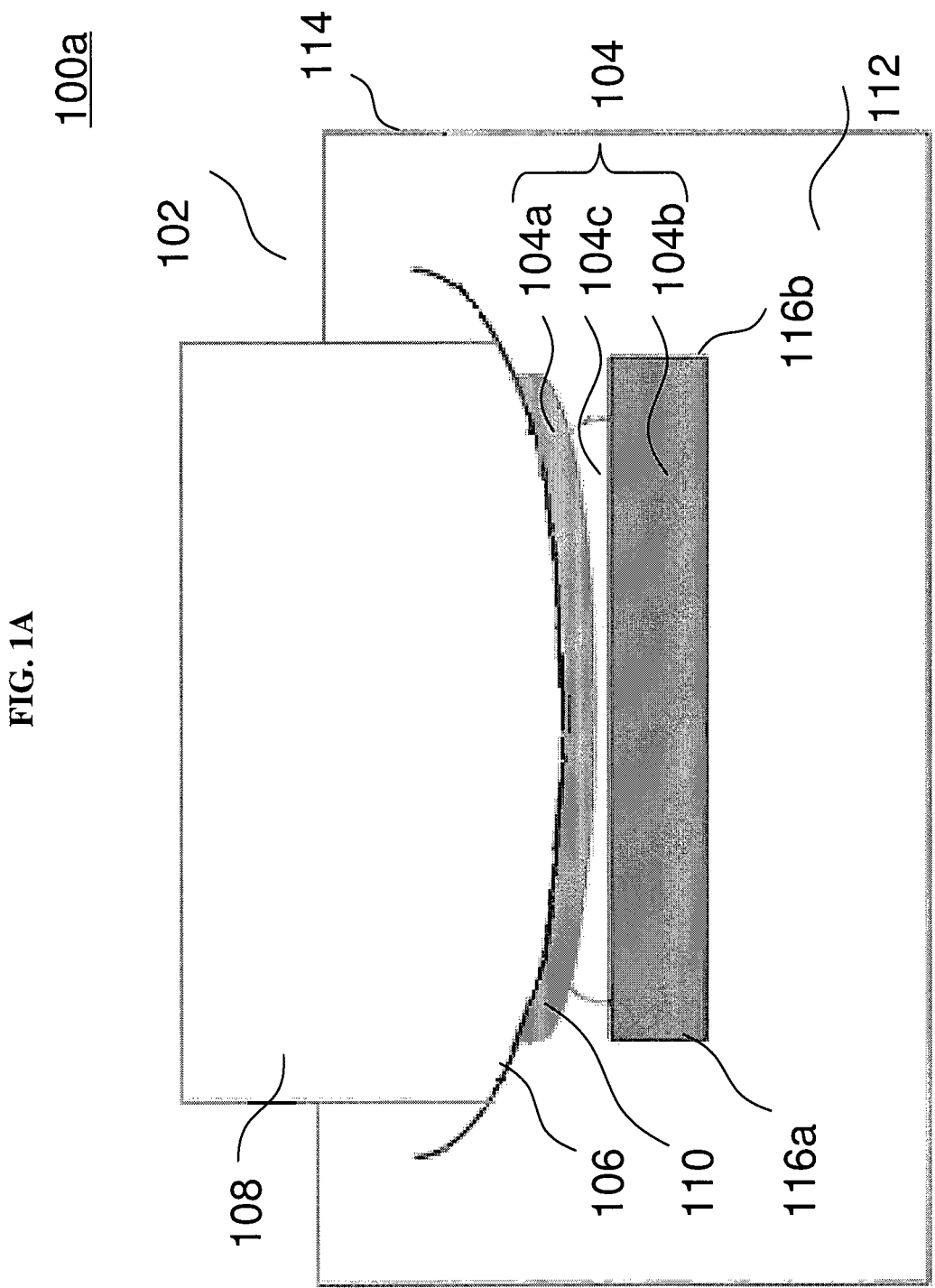
FIG. 1A shows a schematic of an apparatus according to various embodiments for separating a stacked arrangement.

FIG. 1A shows a schematic 100a of an apparatus 102 according to various embodiments for separating a stacked arrangement 104. The stacked arrangement 104 may include a first layer 104a, a second layer 104b and a release layer 104c between the first layer 104a and the second layer 104b. The apparatus 102 may include an attachment surface 106 configured to suspend the stacked arrangement 104 by attaching to the first layer 104a. The apparatus 102 may further include an actuating mechanism 108 configured to form a curvature 110 of the first layer 104a by bending the attachment surface 106. The apparatus 102 may also include a holder 114 to hold an etchant 112 for etching the release layer 104c to separate the first layer 104a from the second layer 104b.

In other words, a stacked arrangement 104 may be provided. The stacked arrangement may include a release layer 104c on the second layer 104b and a first layer 104a on the release layer 104c. An apparatus 102 may be provided to separate the first layer 104a from the second layer 104b by etching of the release layer 104c using an etchant 112. The etchant 112 may be contained in a holder 110. The apparatus 102 may further include an attachment surface 106 to hang the stacked arrangement 104. The stacked arrangement 104 may be hung by attaching the first layer 104a to the attachment surface 106. The attachment surface 106 may be bent by an actuating mechanism 108. The attachment surface 106 may be bent such that the attachment forms a curvature 110.

The first layer 104a may include one or more of a device, a circuit, an interconnect and a metallization. The device may be for instance a solar device, a semiconductor device, an electronic device, a photonic device, a microelectromechanical device, a sensing device or an optoelectronic device. The first layer 104a may include a transistor. For example, the first layer 104a include a metal oxide field effect transistor (MOSFET). The first layer 104a may alternatively or additionally be or include a bipolar transistor. The first layer 104a may include an integrated circuit such as a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor. The first layer 104a may be the starting layer on which devices or structures are formed after etching away the release layer 104c.

The first layer 104a may include additionally or alternatively include a capacitor, an inductor, a resistor or any other electrical components. The first layer 104a may alternatively or additionally include an interconnect such as a metal interconnect and/or a contact such as a metal contact.

The first layer 104a including one or more of a device, a circuit, an interconnect and a metallization may be referred to as a device layer.

The second layer 104b may be or include a substrate. The substrate may be a semiconductor substrate such as a silicon substrate or a gallium arsenide (GaAs) substrate.

The release layer 104c may be made of or include a material that provides a high etch selectivity over the first layer 104a and the second layer 104b. For instance, the first layer 104a and/or the layer 104b may include or may be made of gallium arsenide while the release layer 104c may be made of or include aluminium arsenide. The etchant 112 may be or may include hydrofluoric acid. Hydrofluoric acid may preferentially etch aluminium arsenide over gallium arsenide.

In various embodiments, the first layer 104a may include a plurality of sub layers. For instance, the first layer 104a may include a first sub layer containing n-doped gallium arsenide, a second sub layer containing p-doped gallium arsenide, a third layer containing aluminium gallium arsenide. The plurality of sub-layers may form a solar cell structure.

Figure 1B:
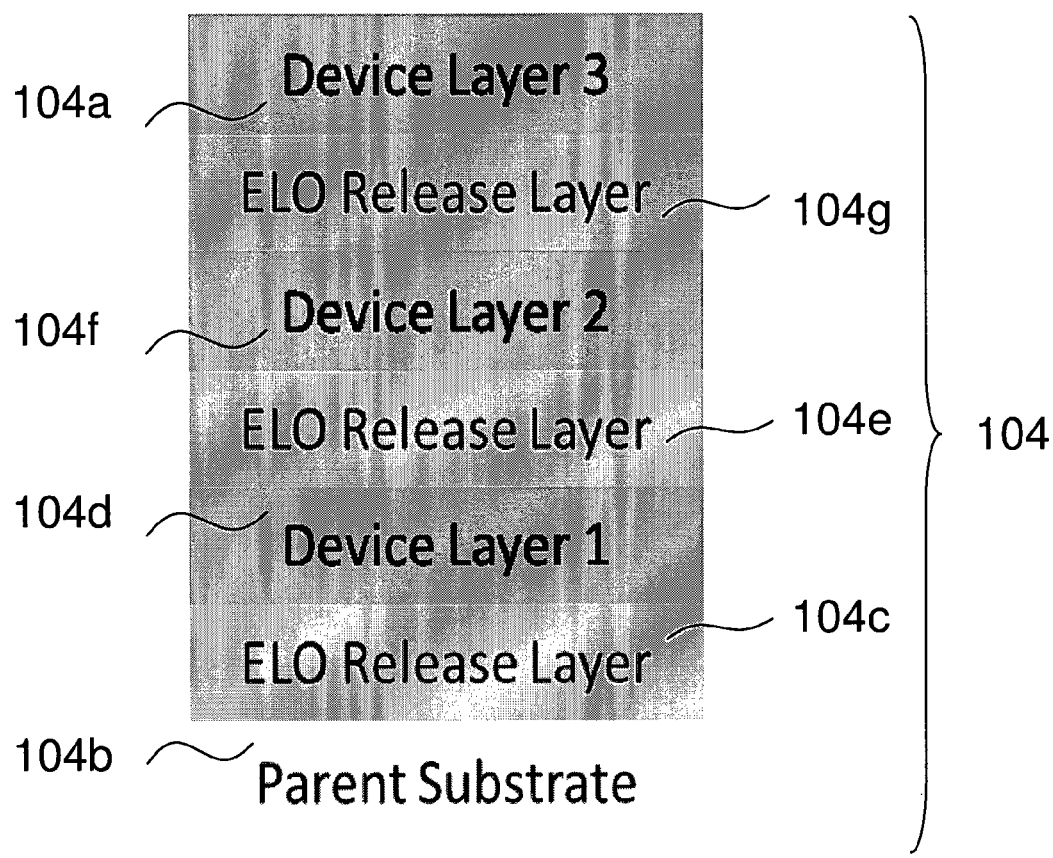
FIG. 1B shows schematic of a stacked arrangement according to various embodiments.

The stacked arrangement 104 may also include one or more additional layer(s). The one or more additional layers may be arranged between the first layer and the release layer. The one or more additional layers may include one or more additional release layers. Each of the one or more release layer(s) may be of the same material or a different material to the release layer 104c. The one or more release layers may be separated by a device layer, i.e. a layer including one or more of a device, a circuit, an interconnect and a metallization. In other words, the stack arrangement 104 may include a plurality of device layers, one device layer separated from another device layer by a release layer. FIG. 1B shows schematic 100b of a stacked arrangement 104 according to various embodiments. The stacked arrangement 104 may include a first layer 104a, a second layer 104b and a release layer 104c between the first layer 104a and the second layer 104b. The stacked arrangement 104 may further include additional layers 104d, 104e, 104f, 104g arranged between the first layer 104a and the release layer 104c. The first layer 104a may be the topmost layer, i.e. the first layer 104a may be the layer in the stacked arrangement 104 furthest from the second layer 104b. The first additional layer 104d may be a device layer. The first additional layer 104d may be arranged on the release layer 104c. The second additional layer 104e may be a release layer. The second additional layer 104e may be arranged on the first additional layer 104d. The third additional layer 104f may be a device layer. The third additional layer 104f may be arranged on the second additional layer 104e. The fourth additional layer 104g may be a release layer. The fourth additional layer 104g may be arranged on the third additional layer 104f. The first layer 104a may be arranged on or over the fourth additional layer 104g.

In various embodiments, suspending or hanging the stacked arrangement 104 by an attachment surface 106 may include that the stacked arrangement 104 is kept from falling due to gravitational force through the exertion of a tensional force opposing the gravitational force on the stacked arrangement 104 by the attachment surface 106. In other words, the stacked arrangement may be kept from falling by exertion of a force pulling away from the stacked arrangement. Corresponding meanings may apply for "suspend", "hang", "suspended" and "hung". The stacked arrangement 104 may be kept from falling due to gravitational forces without requiring a solid support beneath the stacked arrangement 104. The stacked arrangement 104 may be suspended in air or a gas or a fluid or a mixture of gases or a mixture of fluids or a mixture of gases and fluids.

In various embodiments, the attachment surface 106 may be arranged over the holder 114 such that the stacked arrangement 104 attached to the attachment surface 106 may be suspended in the etchant 112. The attachment surface 106 may be suspended above the etchant 112 such that the release layer 102c of the stacked arrangement 102 may be etched by the etchant 112 during operation. The etchant 112 may be a gas or a fluid or a mixture of gases or a mixture of fluids or a mixture of gases and fluids. The etchant 112 may provide a high etching selectivity of the release layer 104c over the first layer 104a and the second layer 104b. In other words, the etchant 112 may be selected such that it preferentially etches the release layer 104c over the first layer 104a and the second layer 104b.

In various embodiments, the holder 114 may be an enclosed container holding the etchant. The etchant 112 may be supplied to the enclosed container via a delivery tube. The attachment surface 106 may be arranged within the holder 114 or at least partially within the holder 114. The attachment surface 106 may be suspended by the holder 114. The attachment surface 106 may be suspended above or within the etchant 112 such that the release layer 104c of the stacked arrangement 104 may be etched by the etchant 112 during operation.

The apparatus 102 may be configured such that the stacked arrangement 104 is etched laterally. The stacked arrangement may have a first lateral side 116a and a second lateral side 116b. The first lateral side 116a may extend from the first layer 104a to the release layer 104c and to the second layer 104b. The second lateral side 116b may extend from the first layer 104a to the release layer 104c and to the second layer 104b. The release layer 104c may be etched by movement of an etch front from the first lateral side 116a of the stacked arrangement 104 towards the second lateral side 116b of the stacked arrangement 104.

In various embodiments, the stacked arrangement may be cylindrical in shape and the first lateral side 116a and the second lateral side 116b may form one continuous surface.

The release layer 104c may be etched such that a continuous etch front is formed along the perimeter or the circumference of the release layer 104c. The continuous etch front may include the etch front that moves from the first lateral side 116a towards the second lateral side 116b. The continuous etch front may include another etch front that moves from the second lateral side 116b towards the first lateral side 116a. The movement of the etch front from the first lateral side 116a towards the second lateral side 116b and the movement of the another etch front from the second lateral side 116b towards the first lateral side 116a may occur simultaneously. In other words, the stacked arrangement 104 may have an axis in the middle of the stacked arrangement 104 extending through the first layer 104a, the second layer 104b and the release layer 104c. As etching continues, the etch front may move from the perimeter or the circumference of the release layer 104c towards the axis.

In various embodiments, the etch front may be widened by pull of gravitational forces on the second layer 104b. Widening the etch front may increase space for diffusion of etchant to the boundary between the etchant and the release layer and/or diffusion of etching products away from the boundary between the etchant and the release layer 104c. The etching of the release layer 104c may be a diffusion limited process. Various embodiments may provide an apparatus 102 configured to etch a stacked arrangement 104 at an increased rate.

In various embodiments, the actuating mechanism 108 may be configured to increase the curvature of the first layer as the etch front moves from the first lateral side to the second lateral side. The actuating mechanism 108 may be configured to increase the curvature 110 of the first layer 104a by bending the attachment surface 106 more. In other words, the actuating mechanism may be configured such that it may be tuned for different degrees of bending of the attachment surface 106. As etching continues and the etch front moves from the first lateral side 116a to the second lateral side 116b, the actuating mechanism 108 may be configured to increase bending of the attachment surface 106. The actuating mechanism 108 may provide dynamic bending adjustment to the attachment surface 106.

The attachment surface 106 may be a flexible surface. The attachment surface 106 may include polypropylene, polyvinyl chloride or polyethylene. The attachment surface 106 may be a plate or a disc.

The actuating mechanism 108 may include an actuator. The actuator may be a mechanical actuator, an electric actuator, a hydraulic actuator or a pneumatic actuator. The actuator may be a linear actuator. Mechanical linear actuators may be or may include screws and nuts, wheel and axle and cam actuators. Mechanical linear actuators may covert rotary motion to linear motion. A screw assembly may include a screw and a nut, the screw having a screw shaft configured to fit into an opening of the nut. The screw shaft may have a threaded surface. The nut may have a threaded inside surface, the inside surface exposed by the opening. The screw and the nut may be configured to cooperate with each other to convert rotary motion of the screw shaft about the nut to linear motion of the screw shaft along the axis running through the opening of the nut, the axis substantially perpendicular to the plane of the nut. For example, by a roller screw or a ball screw may have a threaded shaft. By turning the roller screw or ball screw about a nut with an inner threaded surface, the rotating motion of the screw shaft about the nut may be converted to upwards or downwards motion of the screw shaft relative to the nut. A non-limiting example of a mechanical linear actuator may be a micrometer. By rotating the thimble of a micrometer, a screw shaft within the micrometer may be rotated about a sleeve which is translated to an axial motion of the screw shaft relative to the sleeve. Advantageously, the micrometer may provide dynamic and precise bending adjustment of the attachment surface 106.

The actuator may exert a biasing force on a first portion of the attachment surface 106. The actuating mechanism 108 may further include a fixing mechanism to exert an opposing force opposing the biasing force on a second portion of the attachment surface 106 to bend the attachment surface 106. For instance, rotation of the screw shaft causes the screw shaft to move along an axis relative to the nut or sleeve in a screw assembly or a micrometer. The axis may be substantially perpendicular to an opening of the nut or sleeve. The nut or sleeve may be held stationary. The axial movement of the screw shaft may cause the screw shaft to press on the first portion of the attachment surface 106. As the attachment surface 106 is held in place by the fixing mechanism, the attachment surface 106 may be bent. The attachment surface 106 may be bent by the application of the biasing force on the first portion of the attachment surface 106 and the application of the opposing force on the second portion of the attachment surface 106.

In various embodiments, the apparatus 102 may further include a transmitting portion between the actuator and the attachment surface 106. The biasing force may be transmitted from the actuator to the first portion of the attachment surface 106 via the transmitting portion. The apparatus 102 may further include a plunger between the actuator 108 and transmitting portion. The plunger may be a Teflon, polytetrafluoroethylene, plunger. The transmitting portion may be or may include a central bending screw.

The apparatus 102 may further include a stand. The fixing mechanism may be attached (either directly or indirectly) to the stand. The attachment surface 106 may be suspended from the stand through the fixing mechanism (either directly or indirectly).

The attachment surface 106 may be configured to be attached to the first layer 104a using an adhesive. The adhesive may be a thermal release tape (e.g. a double sided thermal release tape).

Figure 2A:
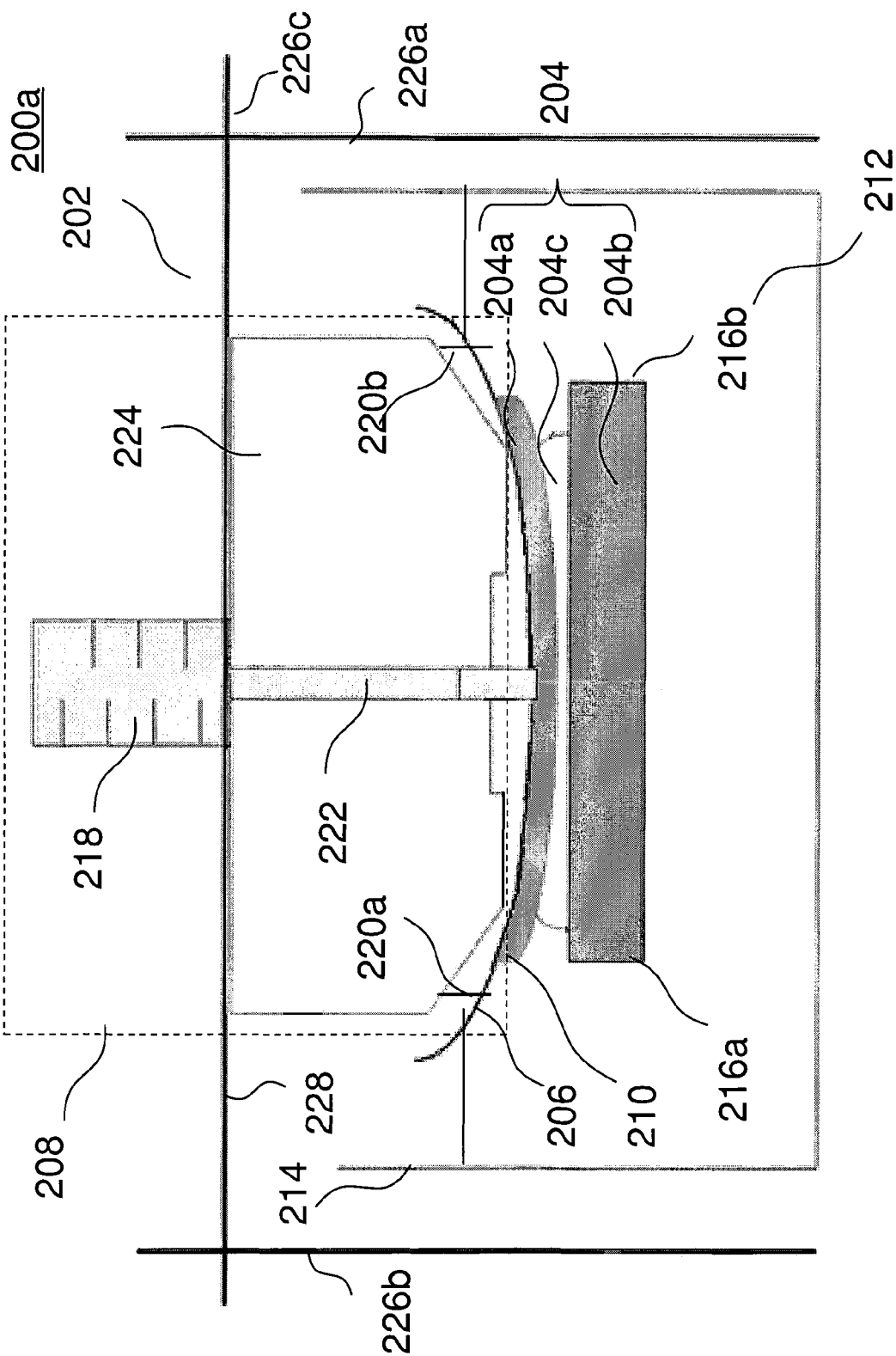
FIG. 2A shows a schematic of an apparatus according to various embodiments for separating a stacked arrangement.

FIG. 2A shows a schematic 200a of an apparatus 202 according to various embodiments for separating a stacked arrangement 204. FIG. 2A shows the stacked arrangement 204 before separation. The stacked arrangement 204 may include a first layer 204a, a second layer 204b and a release layer 204c between the first layer 204a and the second layer 204b. The apparatus 202 may include an attachment surface 206 configured to suspend the stacked arrangement 204 by attaching to the first layer 204a. The apparatus 202 may further include an actuating mechanism 208 configured to form a curvature 210 of the first layer 204a by bending the attachment surface 206. The apparatus 202 may also include a holder 214 to hold an etchant 212 for etching the release layer 204c to separate the first layer 204a from the second layer 204b.

The first layer 204a may include one or more of a device, a circuit, an interconnect and a metallization. The device may be for instance a solar device, a semiconductor device, an electronic device, a photonic device, a microelectromechanical device, a sensing device or an optoelectronic device. The first layer 204a may include a transistor. For example, the first layer 204a include a metal oxide field effect transistor (MOSFET). The first layer 204a may alternatively or additionally be or include a bipolar transistor. The first layer 204a may include an integrated circuit such as a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor.

The first layer 204a may include additionally or alternatively include a capacitor, an inductor, a resistor or any other electrical components. The first layer 204a may alternatively or additionally include an interconnect such as a metal interconnect and/or a contact such as a metal contact.

The first layer 204a including one or more of a device, a circuit, an interconnect and a metallization may be referred to as a device layer.

The second layer 204b may be or include a substrate. The substrate may be a semiconductor substrate such as a silicon substrate or a gallium arsenide (GaAs) substrate.

The release layer 204c may be made of or include a material that provides a high etch selectivity over the first layer 204a and the second layer 204b. For instance, the first layer 204a and/or the second layer 204b may include or may be made of gallium arsenide while the release layer 204c may be made of or include aluminium arsenide. The etchant 212 may be or may include hydrofluoric acid. Hydrofluoric acid may preferentially etch aluminium arsenide over gallium arsenide.

In various embodiments, the first layer 204a may include a plurality of sub layers. For instance, the first layer 204a may include a first sub layer containing n-doped gallium arsenide, a second sub layer containing p-doped gallium arsenide, a third sub layer containing aluminium gallium arsenide. The plurality of sub-layers may form a solar cell structure.

The stacked arrangement 204 may also include one or more additional layer(s). The one or more additional layers may be arranged between the first layer 204a and the release layer 204c. The one or more additional layers may include one or more additional release layers. The one or more release layer(s) may be of the same material or a different material to the release layer 204c. The one or more release layers may be separated by a device layer, i.e. a layer including one or more of a device, a circuit, an interconnect and a metallization. In other words, the stack arrangement 204 may include a plurality of device layers, one device layer separated from another device layer by a release layer.

In various embodiments, suspending or hanging the stacked arrangement 204 by an attachment surface 206 may include that the stacked arrangement 204 is kept from falling due to gravitational force through the exertion of a tensional force opposing the gravitational force on the stacked arrangement 204 by the attachment surface 206. Corresponding meanings may apply for "suspend", "hang", "suspended" and "hung". The stacked arrangement 204 may be kept from falling due to gravitational forces without requiring a solid support beneath the stacked arrangement 204. The stacked arrangement 204 may be suspended in air or a gas or a fluid or a mixture of gases or a mixture of fluids or a mixture of gases and fluids.

In various embodiments, the attachment surface 206 may be arranged over the holder 214 such that the stacked arrangement 204 attached to the attachment surface 206 may be suspended in the etchant 212. The attachment surface 206 may be suspended above the etchant 212 such that the release layer 202c of the stacked arrangement 204 may be etched by the etchant 212 during operation. The etchant 212 may be a gas or a fluid or a mixture of gases or a mixture of fluids or a mixture of gases and fluids. The etchant 212 may provide a high etching selectivity of the release layer 204c over the first layer 204a and the second layer 204b. In other words, the etchant 212 may be selected such that it preferentially etches the release layer 204c over the first layer 204a and the second layer 204b.

In various embodiments, the holder 214 may be an enclosed container holding the etchant 212. The etchant 212 may be supplied to the enclosed container via a delivery tube. The attachment surface 206 may be arranged within the holder 214 or at least partially within the holder 214. The attachment surface 206 may be suspended above or within the etchant 212 such that the release layer 204c of the stacked arrangement 204 may be etched by the etchant 212 during operation.

The apparatus 202 may be configured such that the stacked arrangement 204 is etched laterally. The stacked arrangement may have a first lateral side 216a and a second lateral side 216b. The first lateral side 216a may extend from the first layer 204a to the release layer 204c to the second layer 204b. The second lateral side 216b may extend from the first layer 204a to the release layer 204c to the second layer 204b. The release layer 204c may be etched by movement of an etch front from the first lateral side 216a of the stacked arrangement 204 towards the second lateral side 216b of the stacked arrangement 204.

In various embodiments, the stacked arrangement 204 may be cylindrical in shape and the first lateral side 216a and the second lateral side 216b may form one continuous surface. The stacked arrangement 204 may be or may be included in a wafer.

The release layer 204c may be etched such that a continuous etch front is formed along the perimeter or the circumference of the release layer 204c. The continuous etch front may include the etch front that moves from the first lateral side 216a towards the second lateral side 216b. The continuous etch front may include another etch front that moves from the second lateral side 216b towards the first lateral side 216a. The movement of the etch front from the first lateral side 216a towards the second lateral side 216b and the movement of the another etch front from the second lateral side 216b towards the first lateral side 216a may occur simultaneously. In other words, the stacked arrangement 204 may have an axis in the middle of the stacked arrangement 204 extending through the first layer 204a, the second layer 204b and the release layer 204c. As etching continues, the etch front may move from the perimeter or the circumference of the release layer 204c towards the axis.

In various embodiments, the etch front may be widened by pull of gravitational forces on the second layer 204b. Widening the etch front may increase space for diffusion of etchant to the boundary between the etchant and the release layer and/or diffusion of etching products away from the boundary between the etchant and the release layer 204c. The etching of the release layer 204c may be a diffusion limited process. Various embodiments may provide an apparatus 202 configured to etch a stacked arrangement 204 at an increased rate.

In various embodiments, the actuating mechanism 208 may be configured to increase the curvature of the first layer as the etch front moves from the first lateral side to the second lateral side. The actuating mechanism 208 may be configured to increase the curvature 210 of the first layer 204a by bending the attachment surface 206 more. In other words, the actuating mechanism 208 be configured such that it may be tuned for different degrees of bending of the attachment surface 206. As etching continues and the etch front moves from the first lateral side 216a to the second lateral side 216b, the actuating mechanism 208 may be configured to increase bending of the attachment surface 206. The actuating mechanism 208 may provide dynamic bending adjustment to the attachment surface 206.

The attachment surface 206 may be a flexible surface. The attachment surface 206 may include or be made of, but is not limited to, any of polypropylene, polyvinyl chloride or polyethylene. The attachment surface 206 may be a plate or a disc.

The actuating mechanism 208 may include an actuator 218 such as a mechanical actuator. The actuator 218 may be a linear actuator. The actuator 218 may be a mechanical linear actuator such as a micrometer. By rotating the thimble of a micrometer, a screw shaft within the micrometer may be rotated about a sleeve which is translated to an axial motion of the screw shaft relative to the sleeve. Advantageously, the micrometer may provide dynamic and precise bending adjustment of the attachment surface 206. In various alternate embodiments, the actuator 218 may be a linear actuator controlled electronically. For instance the linear actuator may be controlled via a data cable and an interface. The linear actuator may be electrically connected with the data cable and the interface. The actuator 218 may be covered by a protective covering. The actuator 218 may be protected from for instance, evaporation of the etchant 212, by the protective covering. The protective covering may be a plastic cap.

The actuator 208 may exert a biasing force on a first portion of the attachment surface 206. The actuating mechanism 208 may further include a fixing mechanism to exert an opposing force opposing the biasing force on a second portion of the attachment surface 206 to bend the attachment surface 206. For instance, rotation of the screw shaft causes the screw shaft to move along an axis relative to the sleeve in a micrometer. The axis may be substantially perpendicular to an opening of the sleeve. The sleeve may be held stationary. The axial movement of the screw shaft may cause the screw shaft to press on the first portion of the attachment surface 206. As the attachment surface 206 is held in place by the fixing mechanism, the attachment surface 206 may be bent. The attachment surface 206 may be bent by the application of the biasing force on the first portion of the attachment surface 206 and the application of the opposing force on the second portion of the attachment surface 206.

The attachment surface 206 may be suspended from the stand through the fixing mechanism. The fixing mechanism may fix the attachment surface 206 to the stand. In various embodiments, the fixing mechanism may include a plurality of fixing screws 220a, 220b. The fixing mechanism may further include a base 224. The base 224 may be a base plate. The base 224 may be made of or include a composite material such as Pertinax. The apparatus 202 may further include a stand. The stand may be a platform. The stand may be made of or include stainless steel. Alternatively, the stand may be made of or include other suitable materials such as iron and other types of steel. The fixing mechanism may be attached to the stand. The base 224 may be attached to the stand.

The fixing screws 220a, 220b may be fixed to the base 224. The fixing screw 220a, 220b may exert an opposing force opposing the biasing force on a second portion of the attachment surface 206 to bend the attachment surface 206. The stand may include one or more vertical portions 226a, 226b. The stand may also include one or more horizontal portions 228. The one or more horizontal portions 228 may be suspended across the one or more vertical portions 226a, 226b.

In various embodiments, the apparatus 202 may further include a transmitting portion 222 between the actuator 218 and the attachment surface 206. The transmitting portion 222 may include a central bending screw. The biasing force may be transmitted from the actuator 218 to the first portion of the attachment surface 206 via the transmitting portion 222. The apparatus 202 may further include a plunger between the attachment surface 206 and transmitting portion 222. The plunger may be a Teflon, polytetrafluoroethylene, plunger.

The attachment surface 206 may be configured to be attached to the first layer 204a using an adhesive. The adhesive may be a thermal release tape (e.g. a double sided thermal release tape).

In various embodiments, the stacked arrangement 204 undergoing the epitaxial lift-off process may be adhered to an attachment surface 206 such as a polypropylene flexible plate. The first layer 204a may be attached or mounted onto the attachment surface 206 via adhesion using an adhesive such as a double-sided thermal-release tape. The stack arrangement 204 may be immersed in an etchant solution 212 of high etch selectivity of the release layer 104c. The etchant solution 212 may be contained in a holder 214. The actuator 218 such as a micrometer or linear actuator may provide a translational force through the transmitting portion 222 to bend the attachment surface 206. The actuator 218 may provide the translational force to a first portion of the attachment surface 206 such as the center position of the attachment surface 206. The transmitting portion 222 may be or include a central screw. The attachment surface 206 may be suspended from a stand 226a, 226b, 226c such as a stainless steel platform. The attachment surface 206 may be suspended from the stand 226a, 226b, 226c via a fixing mechanism. The fixing mechanism may include a base 224 such as a Pertinax base plate. The apparatus 202 may further include a Teflon, polytetrafluoroethylene, plunger to connect the actuator 218 and the transmitting portion 222. The fixing mechanism may also include small screws to fix the attachment surface 206 to the base 224. The base 224 may include a through hole configured to contain the transmitting portion 222. When the actuator 218 provides a translational force through the transmitting portion 222 to the first portion the attachment surface 206, the attachment surface 206 may be held to the base 224 by the small screws. The small screws may provide an opposing force opposing the translational force. The opposing force may be applied to a second portion of the attachment surface 206, such as along the perimeter or circumference of the attachment surface 206. A radial curvature may be induced over the stacked arrangement 204 (especially the first layer 204*a*) to open up a lateral etch front of the release layer 204*c*. The second layer 204*b* may be heavier than the first layer 204*a*. The gravitational pull on the second layer 204*b* may assist to widen the lateral etch front of the release layer 204*c*. The widening of the etch front may enhance the etch rate of the release layer 204*c*.

The etch rate of the release layer 204*c* may be enhanced by the gravitational pull on the second layer 204*b* and radial curvature induced over the stacked arrangement 204 (especially the first layer 204*a*) by the attachment surface 206. As etching progresses towards the center of the stacked arrangement 204, the lateral etch rate may be impeded. If the induced curvature is predefined and fixed through etching, the amount of free space associated with the advancing etch front may decrease gradually, resulting in slowed etchants and by-products mass transport exchange. The actuator 218 may be configured to increase the induced curvature of the stack arrangement 204 (especially the first layer 204*a*) continuously or periodically as etching progresses. Increasing the induced curvature of the stack arrangement 204 (especially the first layer 204*a*) continuously or periodically as etching progresses may yield an enhanced etch rate and lift-off of the first layer 204*a*.

Figure 2B:
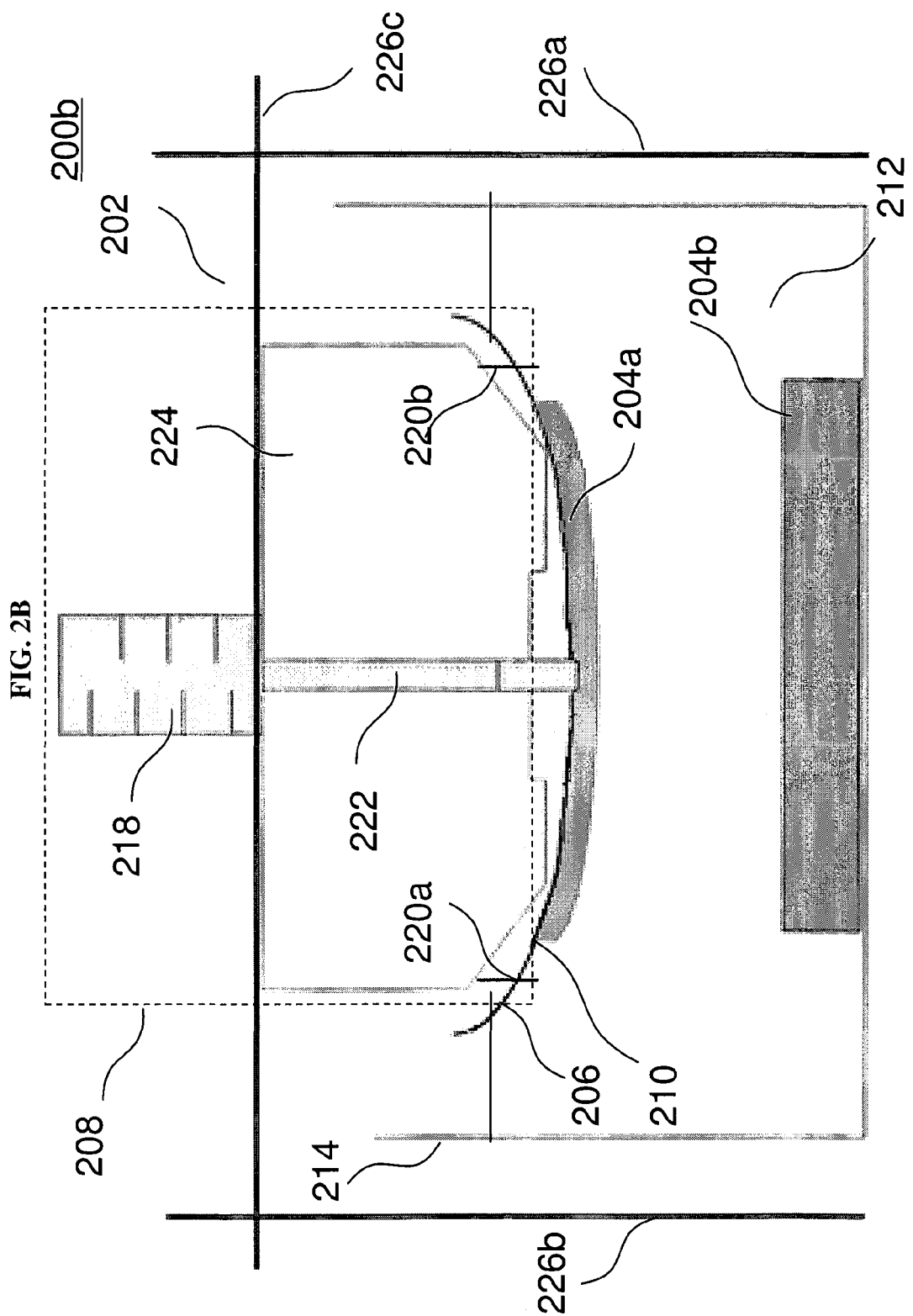
FIG. 2B shows a schematic of an apparatus according to various embodiments for separating a stacked arrangement.

FIG. 2B shows a schematic 200*b* of an apparatus 202 according to various embodiments for separating a stacked arrangement 204. FIG. 2B shows the stacked arrangement 204 after separation. As shown in FIG. 2B, the release layer 204*c* may be etched away by the etchant 212. The second layer 204*b* may be pulled by gravitational forces to the bottom of the holder 214. The first layer 204*a* may remain attached to the attachment surface 206. The first layer 204*a* may be attached to the attachment surface 206 with the adhesive.

Figure 3A:
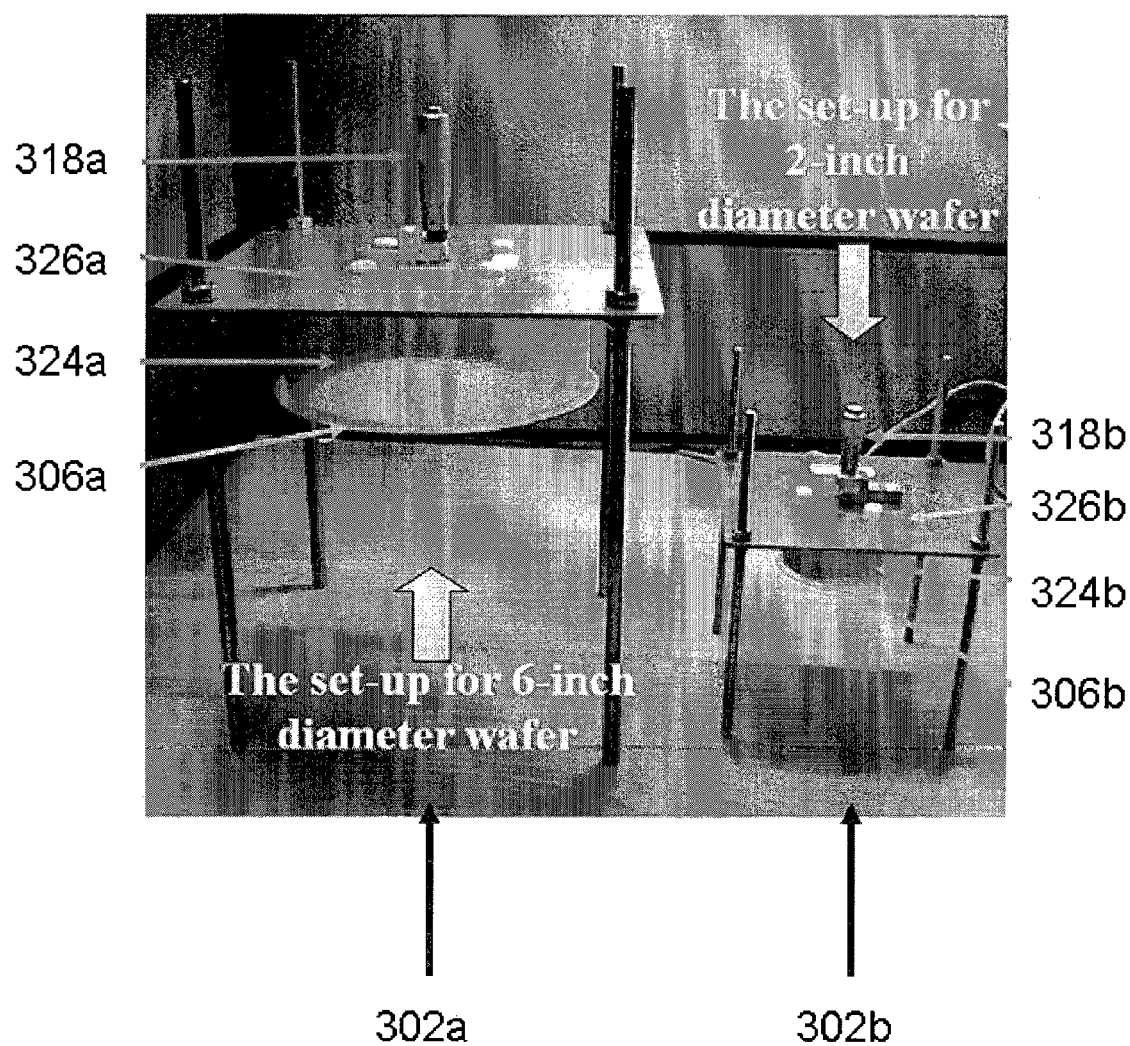
FIG. 3A shows a photo of a side view of apparatuses according to various embodiments for separating stacked arrangements.

FIG. 3A shows a photo of a side view of apparatuses 302*a*, 302*b* according to various embodiments for separating stacked arrangements. The apparatus 302*a* may be configured for a 6-inch diameter wafer while the apparatus 302*b* may be configured for a 2-inch diameter wafer. The apparatuses 302*a*, 302*b* may include an attachment surface 306*a*, 306*b* configured to suspend the stacked arrangement by attaching to the first layer. The apparatuses 302*a*, 302*b* may further include an actuating mechanism configured to form a curvature of the first layer by bending the attachment surface 306*a*, 306*b*. The actuating mechanism may include an actuator 318*a*, 318*b* such as a micrometer. The attachment surface 306*a*, 306*b* may be suspended from a stand 326*a*, 326*b* through a fixing mechanism. The fixing mechanism may include a base 324*a*, 324*b*.

Figure 3B:
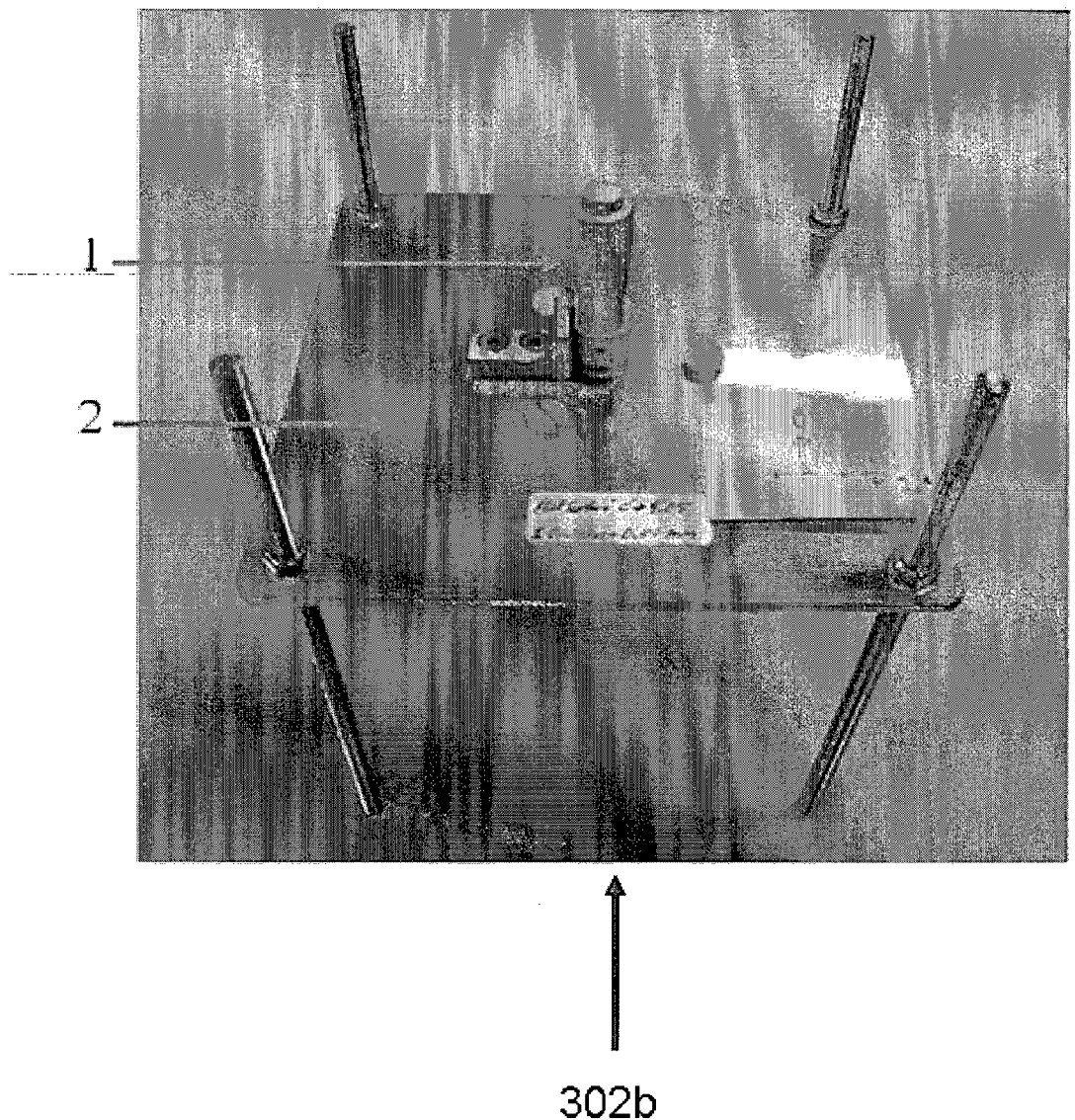
FIG. 3B shows a photo of a top view of an apparatus according to various embodiments for separating stacked arrangements.

FIG. 3B shows a photo of a top view of an apparatus 302*b* according to various embodiments for separating stacked arrangements. FIG. 3B corresponds to the top view of apparatus 302*b* shown in FIG. 3A.

Figure 3C:
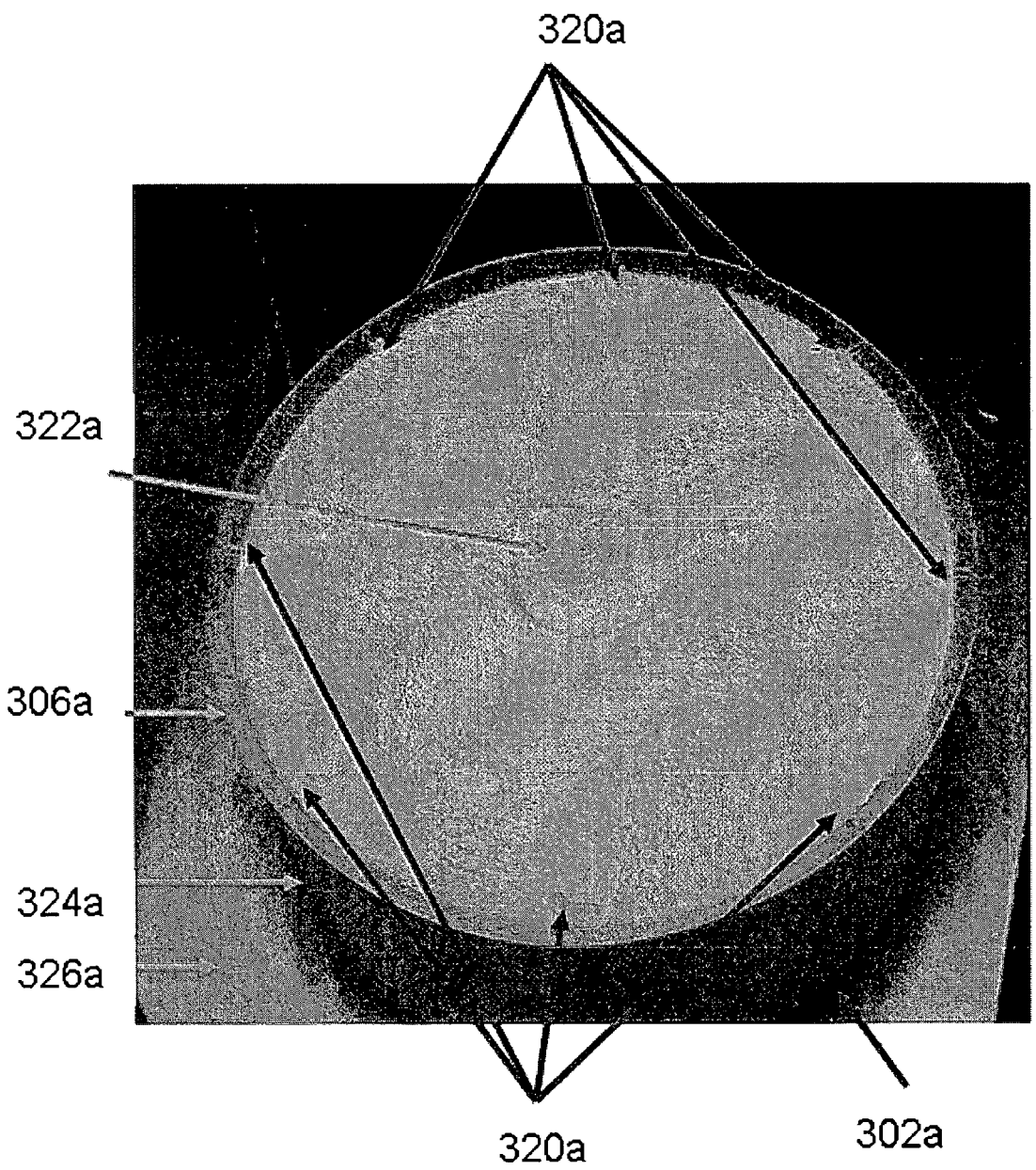
FIG. 3C shows a photo of a bottom view of an apparatus according to various embodiments for separating stacked arrangements.

FIG. 3C shows a photo of a bottom view of an apparatus 302*a* according to various embodiments for separating stacked arrangements. FIG. 3C corresponds to the bottom view of apparatus 302*a* shown in FIG. 3A. The apparatus 302*a* may include a plurality of fixing screws 320*a*. The plurality of fixing screws 320*a* may be fixed to the base 324*a*. There may be eight fixing screws 320*a*.

Figure 3D:
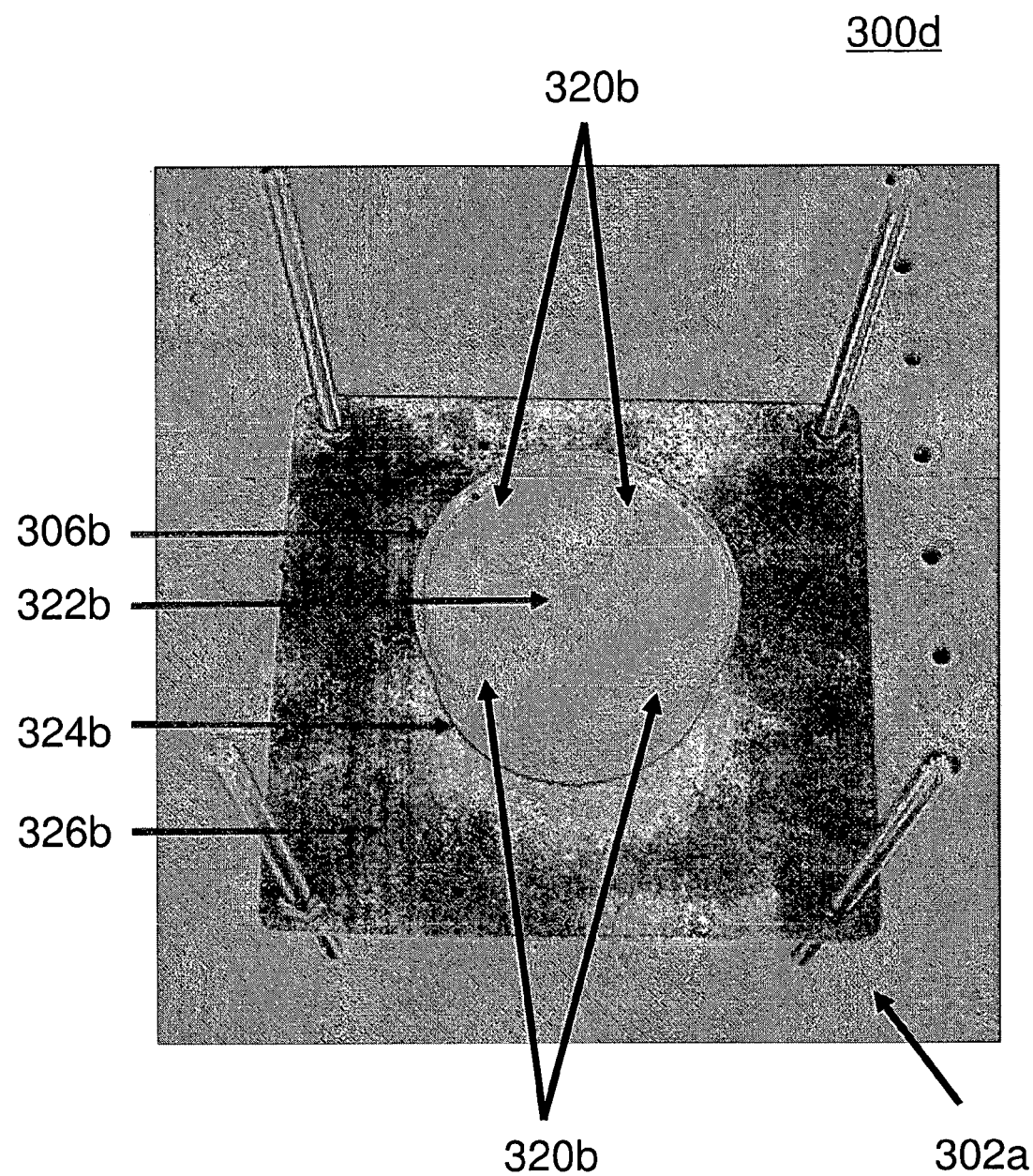
FIG. 3D shows a photo of a bottom view of an apparatus according to various embodiments for separating stacked arrangements.

FIG. 3D shows a photo of a bottom view of an apparatus 302*b* according to various embodiments for separating stacked arrangements. FIG. 3D corresponds to the bottom view of apparatus 302*b* shown in FIG. 3A. The apparatus 302*b* may include a plurality of fixing screws 320*b*. The plurality of fixing screws 320*b* may be fixed to the base 324*b*. There may be four fixing screws 320*b*.

Figure 3E:
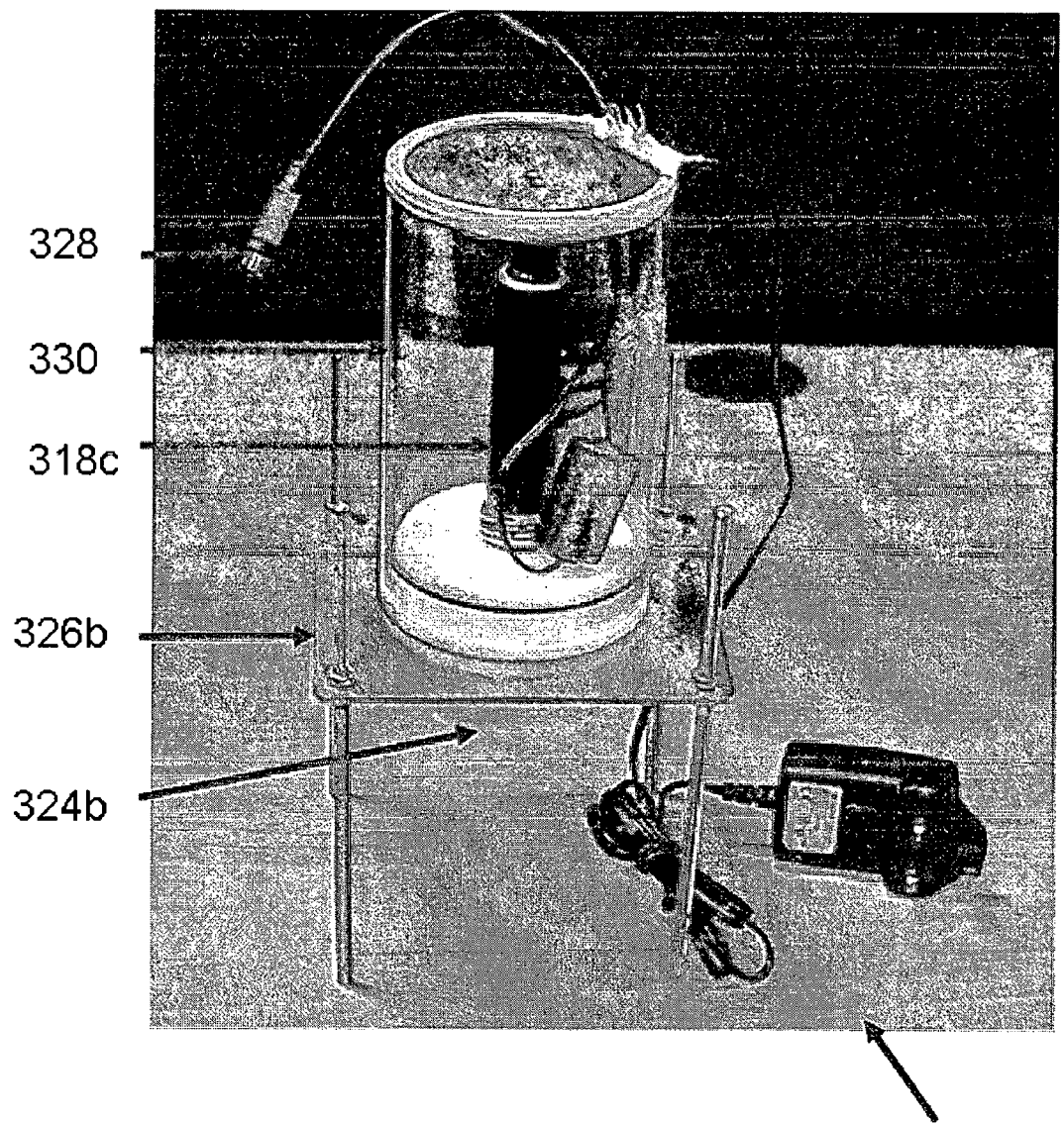
FIG. 3E shows a photo of a side view of an apparatus according to various embodiments for separating stacked arrangements, wherein the micrometer is replaced with an electronic linear actuator.

FIG. 3E shows a photo of a side view of an apparatus 302*b* according to various embodiments for separating stacked arrangements, wherein the micrometer 318*b* is replaced with an electronic linear actuator 318*c*. In various alternate embodiments, the actuator 318 may be a linear actuator controlled electronically. The actuator 318 may be controlled via a data cable and an interface 328. The actuator may 318 be electrically connected with the data cable and the interface 328. The actuator 318 may be covered by a protective covering 330. The actuator 318 may be protected from for instance, evaporation of the etchant, by the protective covering 330. The protective covering 330 may be a plastic cap.

FIG. 4 shows a schematic 400 of a method for separating a stacked arrangement according to various embodiments. The stacked arrangement may include a first layer, a second layer and a release layer between the first layer and the second layer. The method may include in 402, suspending the stacked arrangement by attaching the first layer to an attachment surface. The method may further include in 404, forming a curvature of the first layer of the stacked arrangement by bending the attachment using an actuating mechanism. The method may also include in 406, etching the release layer to separate the first layer from the second layer.

Various embodiments may include an epitaxial lift-off (ELO) process.

In various embodiments, etching the release layer may include moving an etch front from a first lateral side of the stacked arrangement towards a second lateral side of the stacked arrangement.

The etch front may be widened by pull of gravitational forces on the second layer. Widening the etch front may increase amount of free space at the advancing etch front.

The method may further include increasing the curvature of the first layer by increasing bending of the attachment surface using the actuating mechanism as the etch front moves from the first lateral side to the second lateral side. In other words, the method may include increasing the bending of the attachment surface and the first layer. The first layer may be dynamically strained.

Etching may be carried out using an etchant. Increasing the curvature of the first layer may increase the amount of free space at the advancing etch front. Increasing the amount of free space may improve mass transport of etchants. By products such as hydrogen may be produced by the etching process. Increasing the amount of free space may improve mass transport of by products.

Improving the mass transport of etchants and/or products may improve etch rate.

Various embodiments may provide an improved etch rate via a combination increasing the curvature of the first layer by increasing the bending of the attachment surface (dynamic straining) and by widening the etch front by pull of gravitational forces on the second layer. Various embodiments may provide an improved yield and/or throughput.

The etchant may be held in a holder. The method may also include allowing the second layer to sink to the bottom of the holder via gravitational forces. Various embodiments remove the need for external mechanical actions such as by shear or tensile forces, to separate the second layer from the first layer. The removal of the need for external mechanical actions for separating the second layer from the first layer may reduce the likelihood of contamination and damage of the first layer and/or the second layer. The second layer may be recycled.

The etchant may be of high etch selectivity towards the release layer compared to the first layer and the second layer.

The attachment surface is a flexible surface. The flexible surface allows for easier bending.

The actuating mechanism may include an actuator. The actuator may include a micrometer.

In various embodiments, bending the attachment surface may include exerting a biasing force on a first portion of the attachment surface using the actuator and exerting an opposing force opposing the biasing force on a second portion of the attachment surface using a fixing mechanism.

The biasing force may be transmitted from the actuator to the first portion of the attachment via a transmitting portion.

The attachment surface may be suspended to the stand through the fixing mechanism.

The attachment surface may be attached to the first layer using adhesive such as a thermal release tape. The thermal release tape may be a double sided thermal release tape.

The method may further include separating the first layer from the attachment surface. If the first layer is attached to the attachment surface using a thermal release tape, the first layer may be separated from the attachment surface by heating the thermal release tape to a releasing temperature of the thermal release tape. The releasing temperature may be the temperature in which the thermal release tape loses its adhesive property.

In various embodiments, the method may include setting up the apparatus for separating a stacked arrangement. The stacked arrangement may be mounted on an attachment surface (e.g. polypropylene flexible tape) by means of an adhesive (e.g. thermal release tape). The first layer of the stacked arrangement may be adhered to the attachment surface.

The attachment surface and the stacked arrangement may be fixed to the base (e.g. Pertinax base plate) using a plurality of screws. The base is mounted on a stand. An actuator such as a micrometer or linear actuator may be arranged such that it is configured to apply a biasing force to a first portion of the attachment surface during operation. The actuator may be adjusted to apply an initial biasing force to bend the attachment surface. The attachment surface may be bent as it is held by the plurality of screws to the base and to the stand.

The stacked arrangement may be immersed in an etchant solution of good etch selectivity for lateral etching of the release layer. The actuator may be periodically or continually adjusted to prevent etch stagnancy. Etching the release layer between the first layer and the second layer may separate the first layer from the second layer. The first layer may be separated from the attachment surface by heating the adhesive to a temperature such that the adhesive loses its adhesive properties.

Figure 5:
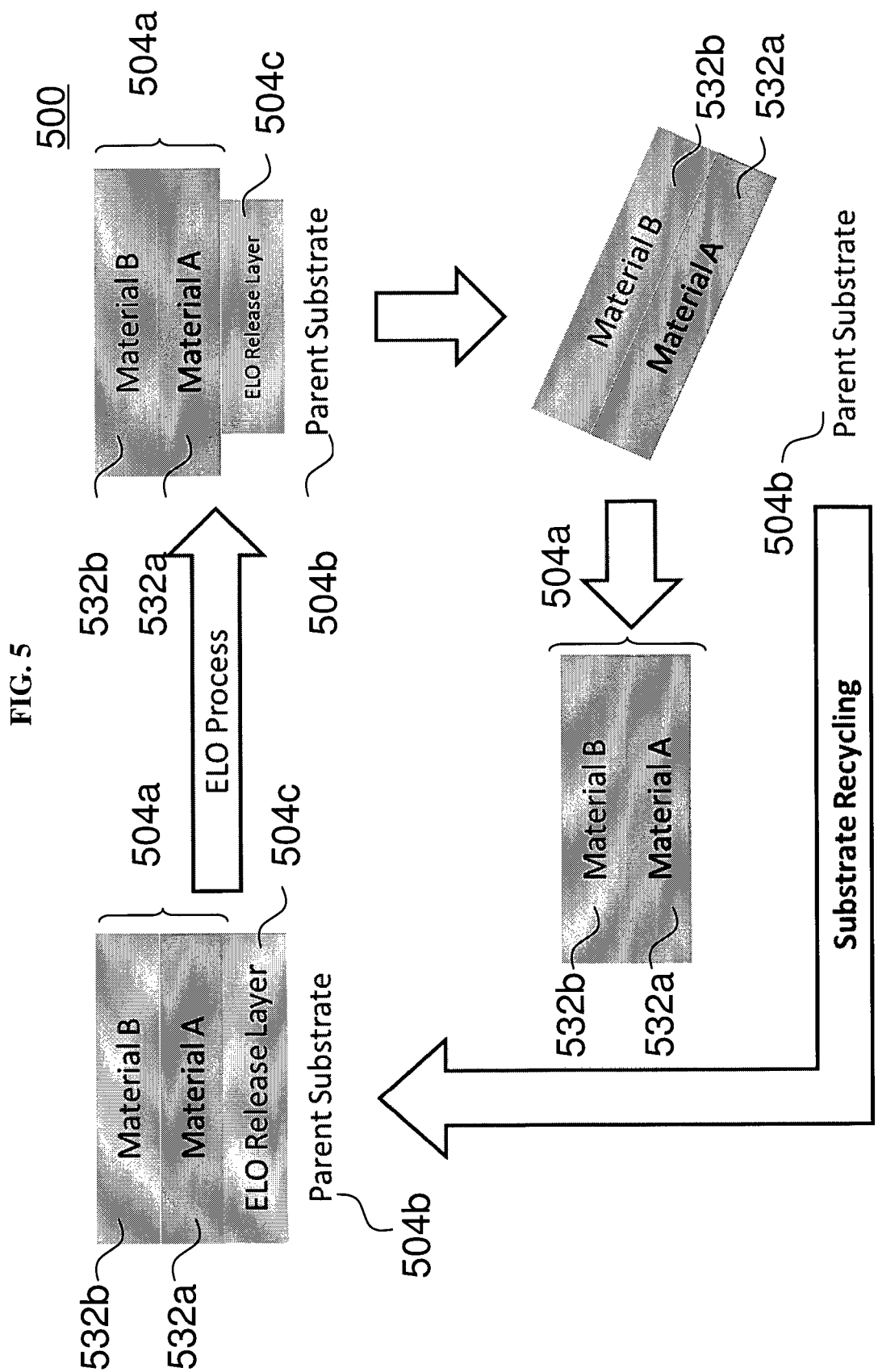
FIG. 5 shows a schematic of a method for separating a stacked arrangement according to various embodiments.

FIG. 5 shows a schematic 500 of a method for separating a stacked arrangement according to various embodiments. The stacked arrangement may include a first layer 504a, a second layer 504b and a release layer 504c between the first layer 504a and the second layer 504b. The first layer 504a may include more than one sub layers. For instance, the first layer 504a may include a first sub layer 532a and a second sub layer 532b. The first layer 504a may include further sub layers. The second layer 504b may also include more than one sub layer. The first sub layer 532a may be made of or include a first material (i.e. Material A). The second sub layer 532b made be made of or include a second material (i.e. Material B). The first sub layer 532a and the second sub layer 532b may be made of or include the same material or different materials. The stacked arrangement may be formed or realized through any form of integration such as, but not limited to bonding and growth. The layers 504a, 504b, 504c may be of any shape and size.

The first layer 504a may be a monolithic integrated substrate. In other words, the monolithic integrated substrate may include the first sub layer 532a and the second sub layer 532b. The second layer 504b may be a parent substrate. The first layer 504a may be separated from the second layer 504b by etching away the release layer 504c. In other words, the method may include etching the release layer 504c to separate the first layer 504a from the second layer 504b. Devices or structures may formed on the first layer 504a before or after etching away the release layer 504c. The second layer 504b may be reused or recycled.

Figure 6:
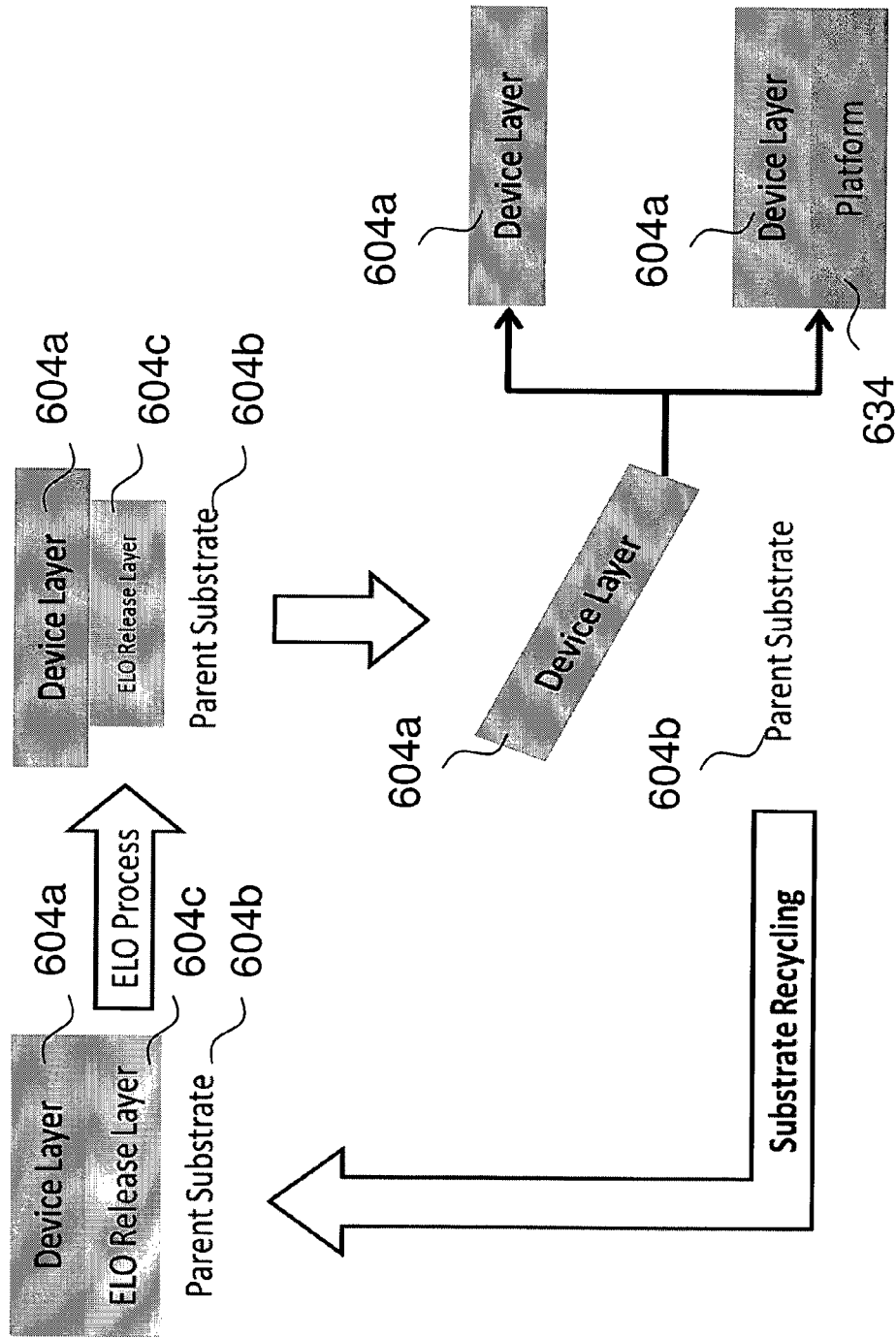
FIG. 6 shows a schematic of a method for separating a stacked arrangement according to various embodiments.

FIG. 6 shows a schematic 600 of a method for separating a stacked arrangement according to various embodiments. The stacked arrangement may include a first layer 604a, a second layer 604b and a release layer 604c between the first layer 604a and the second layer 604b. The stacked arrangement may be formed or realized through any form of integration such as, but not limited to bonding and growth. The layers 604a, 604b, 604c may be of any shape and size.

The first layer 604a may be separated from the second layer 604b by etching away the release layer 604c. In other words, the method may include etching the release layer 604c to separate the first layer 604a from the second layer 604b.

The first layer 604a may include one or more of a device, a circuit, an interconnect and a metallization. The first layer 604a including one or more of a device, a circuit, an interconnect and a metallization may be referred to as a device layer.

The first layer 604a may be made of or include silicon, silicon oxide, gallium arsenide or any other suitable materials. The separated first layer 604a may be used as a standalone film. Alternatively, the separated first layer 604a may be transferred to a further substrate 634 such as a generic or processed platform.

The second layer 604b may be reused or recycled.

Figure 7A:
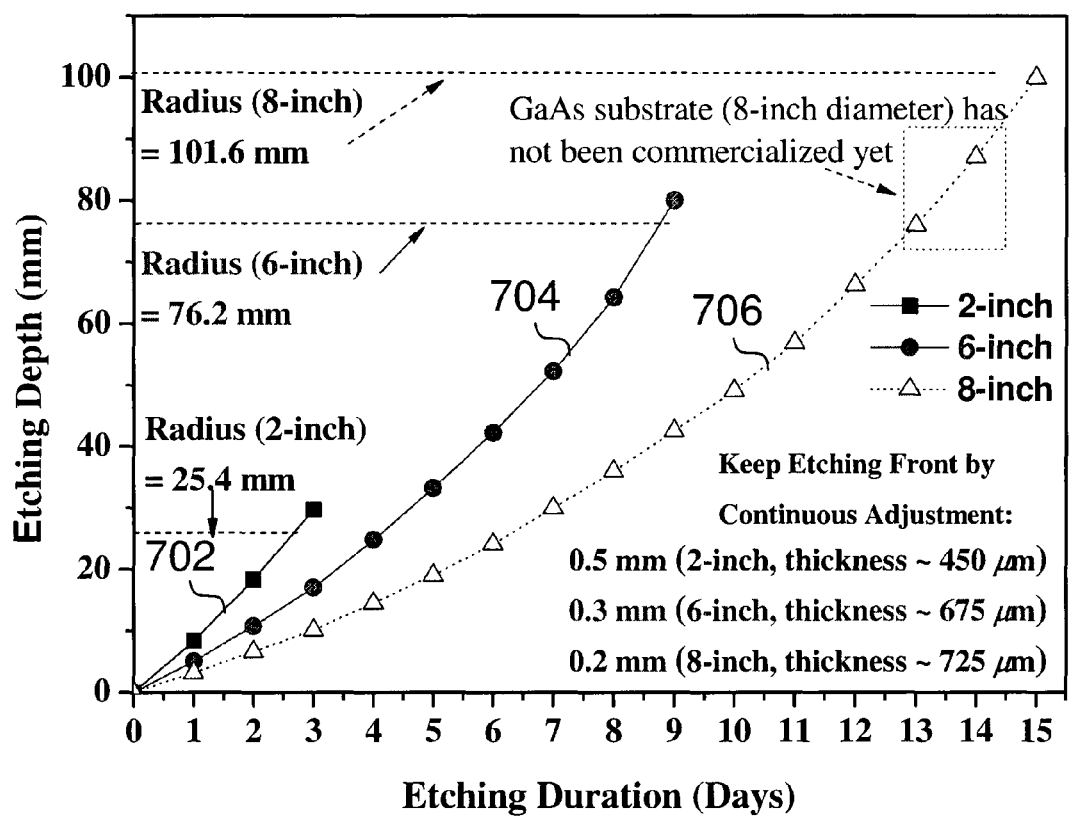
FIG. 7A is a plot showing modeling of lateral etch depth against etching duration of different wafers with different initial amount of initial bending adjustment made by the actuator according to various embodiments.
Figure 7B:
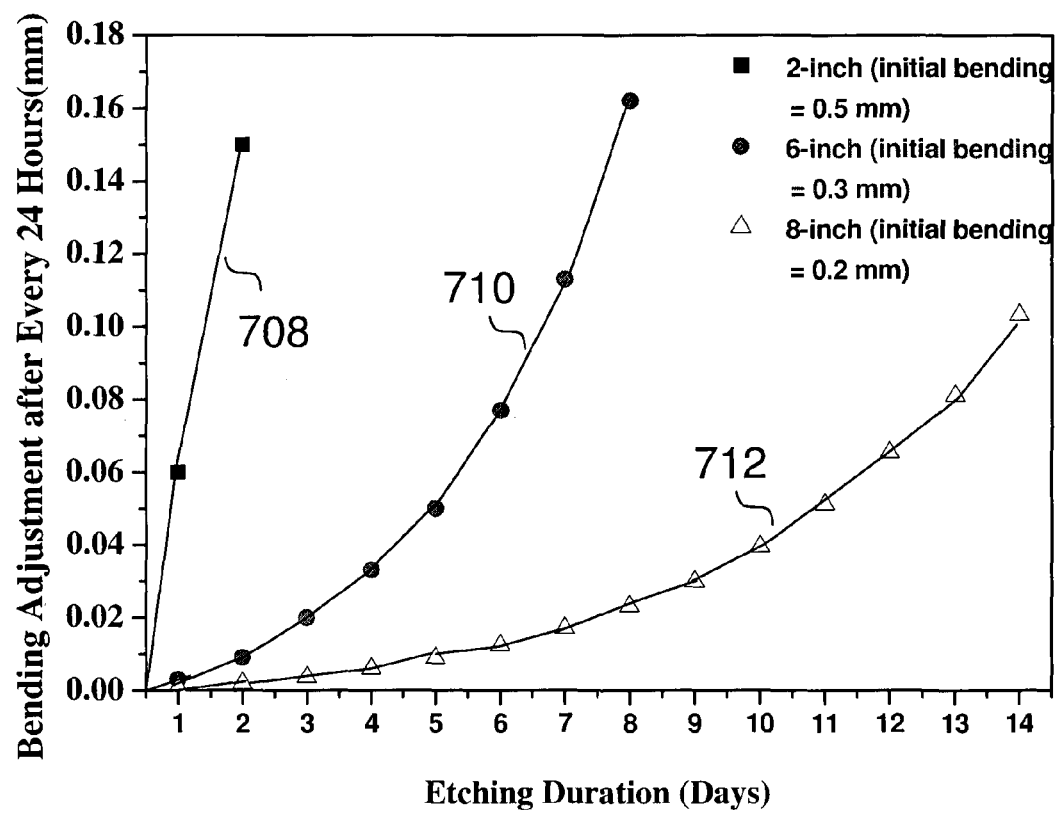
FIG. 7B is a plot showing bending adjustment against etching duration of different wafers with different initial amount of initial bending adjustment made by the actuator according to various embodiments.

A theoretical model may be established to optimize the continuous or periodic bending adjustments in order to obtain the complete release of the first layer within the shortest possible time. A stack arrangement may be formed on a wafer. The first layer of the stack arrangement may be a 1 μm gallium arsenide layer. The second layer of the stack arrangement may be a gallium arsenide substrate. The release layer may be an aluminum arsenide layer. FIG. 7A is a plot 700a showing modeling of lateral etch depth against etching duration of different wafers with different initial amount of initial bending adjustment made by the actuator according to various embodiments. The amount of initial bending adjustment may be indicated by linear translation on a micrometer, wherein the micrometer is the actuator. Line 702 shows the lateral etch depth on a standard 2 inch diameter circular 450 μm wafer with an initial bending adjustment of 0.5 mm as a function of time. Line 704 shows the lateral etch depth on a standard 6 inch diameter circular 675 μm wafer with an initial bending adjustment of 0.3 mm as a function of time. Line 706 shows the lateral etch depth on a standard 8 inch diameter circular 725 μm wafer with an initial bending adjustment of 0.2 mm as a function of time. FIG. 7B is a plot 700b showing bending adjustment against etching duration of different wafers with different initial amount of initial bending adjustment made by the actuator according to various embodiments. Line 708 shows the bending adjustment on a standard 2 inch diameter circular 450 μm wafer with an initial bending adjustment of 0.5 mm as a function of time. Line 710 shows the bending adjustment on a standard 6 inch diameter circular 675 μm wafer with an initial bending adjustment of 0.3 mm as a function of time. Line 712 shows the bending adjustment on a standard 8 inch diameter circular 725 μm wafer with an initial bending adjustment of 0.2 mm as a function of time. The bending adjustment may be made every 24 hours. Line 708 shows the bending adjustments on the 2 inch wafer. After the $1^{st}$ day, the bending adjustment may be increased by 0.09 mm. After the $2^{nd}$ day, the bending adjustment may be increased by 0.15 mm.

Various embodiments may allow large scale monolithic integration of dissimilar materials within a singular platform, including monolithic integration for wafers 8 inches and above in which commercial solutions may not be readily available presently.

Various embodiments may allow for a wide range of devices such as, but not limited to, photovoltaics, optoelectronics, microelectromechanical systems and sensors, to be realized on a single platform. Devices from different fields such as electrical and electronics, mechanics and biology may be combined on a single platform.

Various embodiments may allow for on-insulator high performance devices.

Various embodiments may reduce manufacturing costs. Costs may be lowered through any of substrate recycling, increase efficiency of large scale ELO of stacked arrangements with multiple release layers or simplified process due to self separation of the second layer from the first layer after etching of the release layer.

As shown in FIG. 7A, the release layer of the 2 inch diameter wafer may be completely etched and the first layer may be separated from the second layer of the 2 inch diameter wafer within 71 hours (approximately 3 days). The release layer of the 6 inch diameter wafer may be completely etched and the first layer may be separated from the second layer of the 6 inch diameter wafer at around 9 days. The release layer of the 8 inch diameter wafer may be completely etched and the first layer may be separated from the second layer of the 8 inch diameter wafer at around 15 days.

Figure 8A:
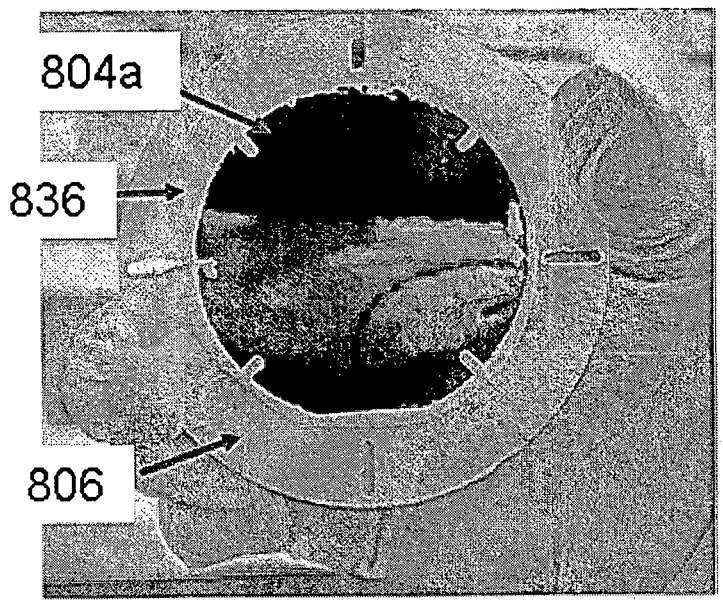
FIG. 8A shows a photo of a separated first layer on an attachment surface according to various embodiments.
Figure 8B:
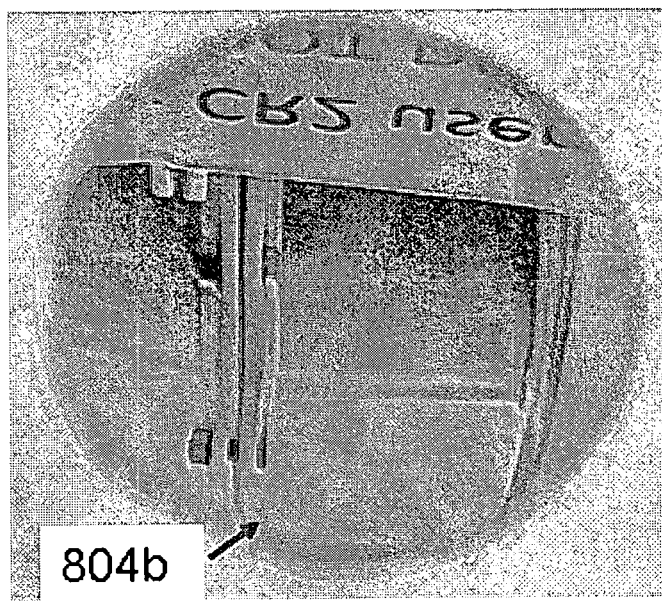
FIG. 8B shows a photo of a separated second layer according to various embodiments.

FIG. 8A shows a photo 800a of a separated first layer 804a on an attachment surface 806 according to various embodiments. The first layer 804a may be a layer of a stacked arrangement formed on a 2 inch diameter wafer. The separated first layer 804a may be attached to the attachment surface 806 using an adhesive 836. FIG. 8B shows a photo 800b of a separated second layer 804b according to various embodiments. The second layer 804b may be a layer of a stacked arrangement formed on a 2 inch diameter wafer. Experiment results show that the release layer between the first layer 804a and the second layer 804b may be completely etched in 76 hours, which are in good agreement with the theoretical calculations.

Figure 9A:
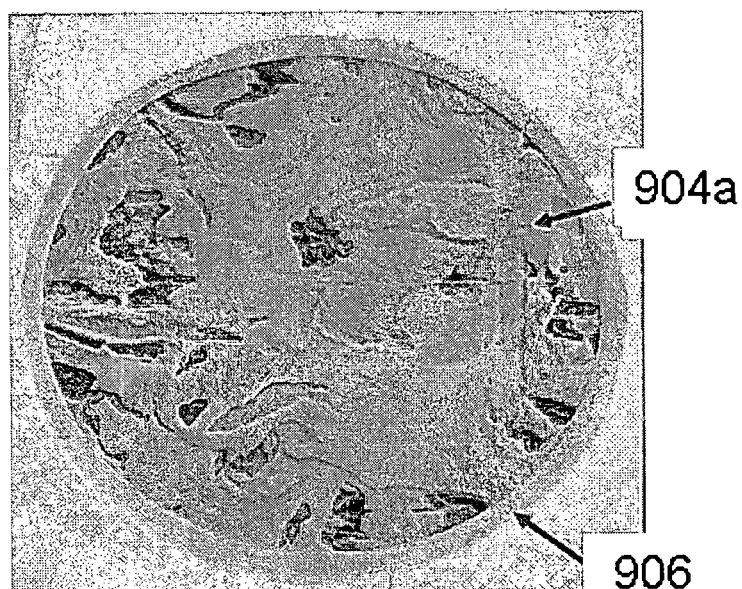
FIG. 9A show a photo having a top view of a separated first layer on a attachment surface according to various embodiments.
Figure 9B:
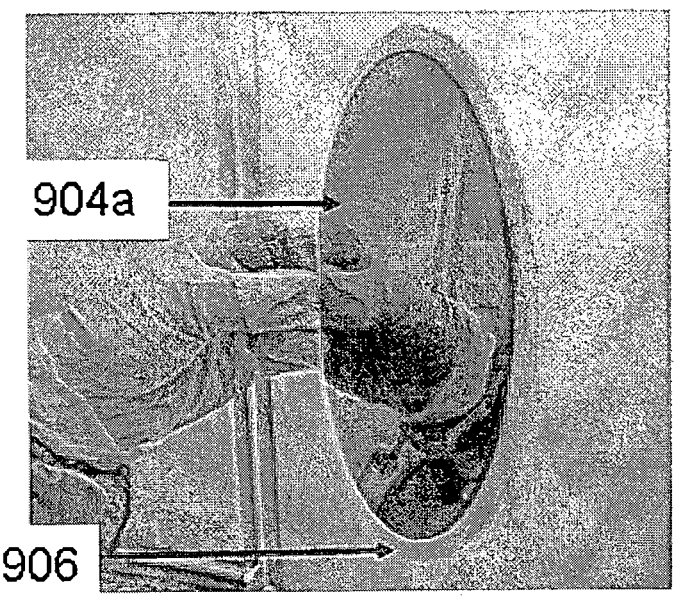
FIG. 9B shows a photo having a side view of the separated first layer on the attachment surface according to various embodiments.

FIG. 9A show a photo 900a having a top view of a separated first layer 904a on a attachment surface 906 according to various embodiments. FIG. 9B shows a photo 900b having a side view of the separated first layer 904a on the attachment surface 906 according to various embodiments. The first layer 904a may be a layer of a stacked arrangement formed on a 6 inch diameter wafer. Experiment results show that the release layer between the first layer 904a and the second layer may be completely etched in approximately 10 days, which are in good agreement with the theoretical calculations.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An apparatus for separating a stacked arrangement comprising a first layer, a second layer and a release layer between the first layer and the second layer, the apparatus comprising:
   an attachment surface configured to suspend the stacked arrangement by attaching to the first layer, wherein the attachment surface comprises a flexible plate;
   an actuating mechanism configured to form a curvature of the first layer by bending the attachment surface; and
   a holder configured to hold an etchant for etching the release layer to separate the first layer from the second layer.

2. The apparatus according to claim 1,
   wherein the release layer is etched by movement of an etch front from a first lateral side of the stacked arrangement towards a second lateral side of the stacked arrangement.

3. The apparatus according to claim 2,
   wherein the etch front is widened by pull of gravitational forces on the second layer.

4. The apparatus according to claim 2,
   wherein the actuating mechanism is configured to increase the curvature of the first layer as the etch front moves from the first lateral side to the second lateral side.

5. The apparatus according to claim 1,
   wherein the actuating mechanism comprises an actuator.

6. The apparatus according to claim 5,
   wherein the actuator comprises a micrometer.

7. The apparatus according to claim 5,
   wherein the actuator exerts a biasing force on a first portion of the attachment surface; and
   wherein the actuating mechanism further comprises a fixing mechanism to exert an opposing force opposing the biasing force on a second portion of the attachment surface to bend the attachment surface.

8. The apparatus according to claim 7 further comprising:
   a transmitting portion between the actuator and the attachment surface; and
   a polytetrafluoroethylene plunger between the attachment surface and the transmitting portion, wherein the biasing force is transmitted from the actuator to the first portion of the attachment surface via the transmitting portion.

9. The apparatus according to claim 7 further comprising: a stand;
wherein the fixing mechanism is attached to the stand.

10. The apparatus according to claim 1,
wherein the attachment surface is configured to be attached to the first layer using an adhesive.

11. A method for separating a stacked arrangement comprising a first layer, a second layer and a release layer between the first layer and the second layer comprising:
    suspending the stacked arrangement by attaching the first layer to an attachment surface, wherein the attachment surface comprises a flexible plate;
    forming a curvature of the first layer of the stacked arrangement by bending the attachment surface using an actuating mechanism; and
    etching the release layer to separate the first layer from the second layer.

12. The method according to claim 11,
wherein etching the release layer comprises moving an etch front from a first lateral side of the stacked arrangement towards a second lateral side of the stacked arrangement.

13. The method according to claim 12,
wherein the etch front is widened by pull of gravitational forces on the second layer.

14. The method according to claim 12, the method further comprising:
    increasing the curvature of the first layer by increasing bending of the attachment surface using the actuating mechanism as the etch front moves from the first lateral side to the second lateral side.

15. The method according to claim 11,
wherein the actuating mechanism comprises an actuator.

16. The method according to claim 15,
wherein the actuator comprises a micrometer.

17. The method according to claim 15,
wherein bending the attachment surface comprises exerting a biasing force on a first portion of the attachment surface using the actuator and exerting another force opposing the biasing force on a second portion of the attachment surface using a fixing mechanism.

18. The method according to claim 11,
wherein the attachment surface is attached to the first layer using an adhesive.

* * * * *